United States Patent
Coico et al.

(10) Patent No.: US 7,518,235 B2
(45) Date of Patent: Apr. 14, 2009

(54) METHOD AND STRUCTURE TO PROVIDE BALANCED MECHANICAL LOADING OF DEVICES IN COMPRESSIVELY LOADED ENVIRONMENTS

(75) Inventors: Patrick A. Coico, Fishkill, NY (US); David L. Edwards, Poughkeepsie, NY (US); Benjamin V. Fasano, New Windsor, NY (US); Lewis S. Goldmann, Bedford, NY (US); Ellyn M. Ingalls, Danbury, CT (US); Michael S. June, Raleigh, NC (US); Hilton T. Toy, Hopewell Junction, NY (US); Paul A. Zucco, Saugerties, NY (US)

(73) Assignee: International Business Machines Corporation, Armonk, NY (US)

( * ) Notice: Subject to any disclaimer, the term of this patent is extended or adjusted under 35 U.S.C. 154(b) by 225 days.

(21) Appl. No.: 10/906,809

(22) Filed: Mar. 8, 2005

(65) Prior Publication Data
US 2006/0202325 A1 Sep. 14, 2006

(51) Int. Cl.
*H01L 23/34* (2006.01)
(52) U.S. Cl. ............ 257/719; 257/717; 257/E23.084; 361/704

(58) Field of Classification Search .......... 257/718, 257/171, 719, 717, E23.084
See application file for complete search history.

(56) References Cited

U.S. PATENT DOCUMENTS

| | | | |
|---|---|---|---|
| 5,413,489 A * | 5/1995 | Switky | 439/71 |
| 5,619,399 A * | 4/1997 | Mok | 361/707 |
| 5,901,039 A * | 5/1999 | Dehaine et al. | 361/704 |
| 5,920,120 A * | 7/1999 | Webb et al. | 257/719 |
| 5,926,371 A | 7/1999 | Dolbear | |
| 6,349,032 B1 * | 2/2002 | Chan et al. | 257/719 |
| 6,563,213 B1 | 5/2003 | Wong et al. | |
| 6,750,551 B1 * | 6/2004 | Frutschy et al. | 257/785 |
| 2003/0127714 A1 * | 7/2003 | Behun et al. | 257/675 |
| 2004/0084764 A1 * | 5/2004 | Ishimine et al. | 257/706 |

* cited by examiner

*Primary Examiner*—Howard Weiss
*Assistant Examiner*—John C Ingham
(74) *Attorney, Agent, or Firm*—Gibb I.P. Law Firm, LLC; Wenjie Li, Esq.

(57) ABSTRACT

An integrated circuit chip mounting structure includes a chip carrier electrically connected to a circuit board with an integrated circuit chip mounted on the chip carrier. In addition, a thermally conductive device is thermally connected to the chip and a set of compressible support members are provided to transmit a portion of an applied compressive load from the thermally conductive device to the chip and chip carrier.

6 Claims, 7 Drawing Sheets

116

METHOD AND STRUCTURE TO PROVIDE BALANCED MECHANICAL LOADING OF DEVICES IN COMPRESSIVELY LOADED ENVIRONMENTS

BACKGROUND OF THE INVENTION

1. Field of the Invention

The invention generally relates to a structure and a method for forming an integrated circuit chip carrier structure and more particularly to an integrated circuit chip mounted on a chip carrier with a set of compressible support members that transmit force from a thermally conductive device to the chip carrier.

2. Description of the Related Art

High power electronic devices are often cooled by bonding them to a good thermal conductor. In common configurations, this is accomplished by first joining the front (circuit) side of a flip chip to a substrate or carrier using electrical conductors (e.g., solder balls). A thermal conductor (a heat spreader or heatsink) is then bonded to the back side of the die using curable organic materials or a solder. In either case, the gap between the die and the thermal conductor should be made as thin as possible to minimize the thermal resistance path without impacting the thermal reliability of the structure.

There are several types of LGA interposers in the market. What they have in common is that they have features that align the interposer to the substrate (chip carrier) and features that aligns the interposer to the card/board, and they have a means of keeping the array of electrical contacts in alignment. They types of contacts vary widely, from springs, to organics, to types of buttons. Each of these types of interposers has some minimum load that is required at each contact to achieve and maintain the required electrical performance. The higher the minimum load, the higher the total required load, the more challenging (and sometimes costly) the solution becomes.

In many cases, the substrate is connected to other components (e.g., board, mothercard, etc.) using a compressive load. This load may serve to physically position and electrically connect the substrate to other components (i.e., using an LGA, land grid array interposer). Ideally, the load is applied uniformly on the substrate using the contact area of the chip. However, for designs in which the die is substantially smaller in area than the substrate, placing a load onto the die to affect a compressive load can cause deformation of the substrate, stress in the thermal interface adhesive, stress in the chip and solder interconnections, highly non-uniform LGA loading, and failure of the assembly. The more uniform that load can be generated, the lower the total load is. Some of the design options for generating uniform loads are the means that the load is applied to the chip carrier, the stiffness of that carrier (thickness and material selection), and the stiffness of the backing plate (thickness and material selection). The invention described below provides a solution to this problem by utilizing structures that distributed the load being imparted by the heatsink partially to the chip and partially to the chip carrier.

SUMMARY OF THE INVENTION

This disclosure presents an integrated circuit chip carrier structure that includes a chip carrier connected to a circuit board with an integrated circuit chip mounted on the chip carrier. In addition, a thermally conductive device is connected to the chip or heat spreader, and a set of compressible support members are positioned to transmit part of an applied load from the thermally conductive device to the chip carrier.

The support members can comprise springs, a portion of compressible material, and at least one compressible ring. In the case of use of multiple compressible rings, the rings may have different durometers (different rates of compressibility or coefficients of elasticity). These compressible support members are positioned to transmit part of an applied load to the chip carrier from the thermally conductive device at different distances from the integrated circuit chip. For example, the compressible support members comprise different sized compressible frames having different durometer values.

In addition, spring loaded alignment posts are connected to the thermally conductive device. The alignment posts extend through openings in the circuit board, and the alignment posts are positioned outside a periphery of the chip carrier. Force transmitted through the conductive device is distributed between the integrated circuit chip and the chip carrier by the compressible support members.

In another embodiment, a rigid frame is positioned at corners of the chip carrier. In this embodiment, the alignment posts extend through openings in the circuit board and openings in the frame and a compressible support member is positioned around an upper section of the alignment posts between the thermally conductive device and the frame.

The rigid frame is adapted to impart, on the chip carrier, force transmitted from the thermally conductive device through the compressible support member. Thus, the force transmitted through the conductive device is distributed between the integrated circuit chip and the chip carrier by the compressible support member and the rigid frame.

The frame has an L-shape in cross-section and includes a first portion that extends over the chip carrier and a second portion through which the alignment posts pass. The compressible support member comprises at least one of springs, a tube of compressible material, and a compressible ring or frame. The rigid frame can comprise a continuous or a discontinuous structure.

Another embodiment can include the compressible support tube positioned around the upper section of the alignment posts between the thermally conductive device in addition to one or more compressible support members positioned between the thermally conductive device and the chip carrier. Further, secondary support tubes can be positioned on the lower section of the alignment posts.

These, and other, aspects and objects of the present invention will be better appreciated and understood when considered in conjunction with the following description and the accompanying drawings. It should be understood, however, that the following description, while indicating embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED EMBODIMENTS OF THE INVENTION

Figure 1:
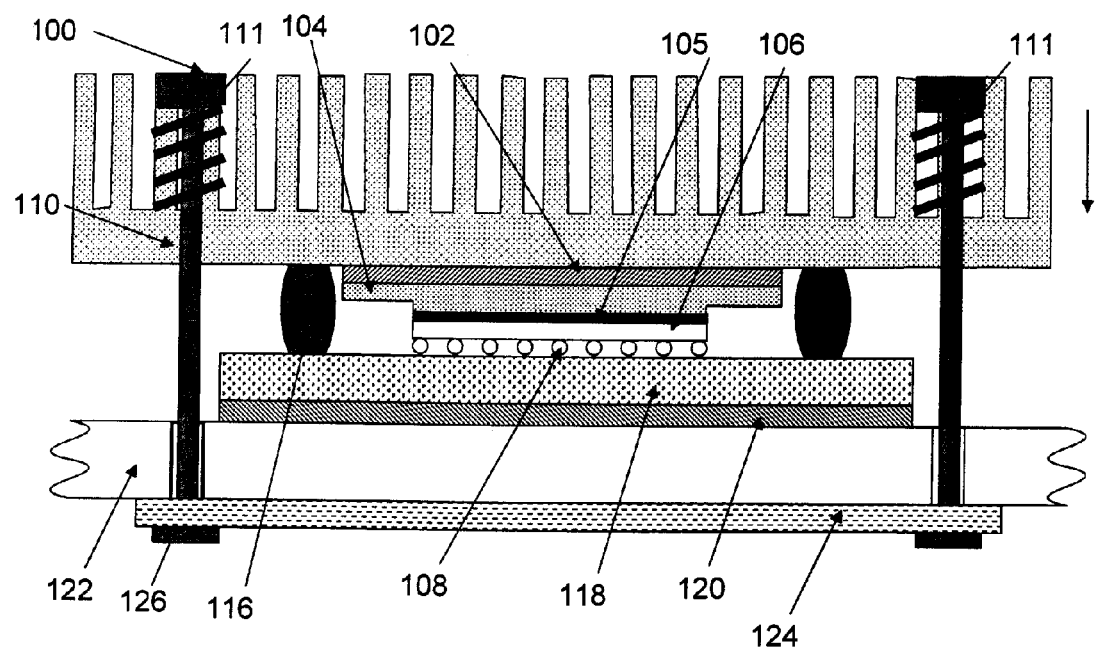
FIG. 1 is cross-sectional schematic diagram of an integrated circuit structure.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

While the shape, position, and usage of many of the devices mentioned herein were not previously known, the methods of manufacturing and materials used to manufacture such devices has been disclosed previously. For example, U.S. Pat. Nos. 5,926,371; 6,349,032; and 6,563,213 (hereinafter referred to sometimes as "previous patents") which are incorporated herein by reference, disclose methods of manufacturing specific devices and materials used in such manufacturing processes. In order to focus the reader on the salient points on the invention, a redundant discussion of such manufacturing methods and materials used in such manufacturing is avoided herein.

The invention is different from the previous patents because the invention can apply a large load to the die (or heat spreader) to maintain a small gap to improve thermal performance. The previous patents remove the load from the die to prevent failure or solder (C4) connections. The invention can maintain a fixed and uniform load across the carrier underside and exert a uniform load to the LGA (if that is what is being used for carrier-board connections). Thus, the invention applies load to both the chip and the carrier.

As mentioned above, the invention provides a solution to problems that occur when force is applied to an integrated circuit chip through a heatsink by utilizing structures that distribute the load being imparted by the heatsink partially to the chip and partially to the chip carrier. More specifically, as shown in FIG. 1, in one embodiment, the inventive structure comprises an integrated circuit chip structure that includes a chip carrier 118 connected to a circuit board 122 with an integrated circuit chip 106 mounted on the chip carrier 118. In addition, a thermally conductive device 100 is connected (directly or indirectly using a heat spreader or lid 104) to the chip 105 using a thermally conductive adhesive (not shown) and a set of compressible support members are positioned between the thermally conductive device 100 and the chip carrier 118.

As would be understood by one ordinarily skilled in the art, the thermally conductive device 100 can comprise a an air-cooled heatsink with fins, a thermal conductor without fins, a liquid cooled cold plate, any other passive form of thermal conductor, any form of active thermal conductor, etc. A conventionally known thermal paste, PCM (phase change material), and/or adhesive 102 is utilized to thermally connect the thermally conductive device 100 to the heat spreader 104 or the chip 106. The integrated circuit chip 106 is generally joined to the chip carrier 118 using electrically conductive solder or other similar contacts 108. The opposite side of chip 106 is connected to heat spreader 104 by thermally conductive adhesive 105. The chip carrier 118 is connected to the circuit board 122 (such as a printed circuit board, etc.) using an LGA interposer 120 that provides electrical connections.

Figure 5A:
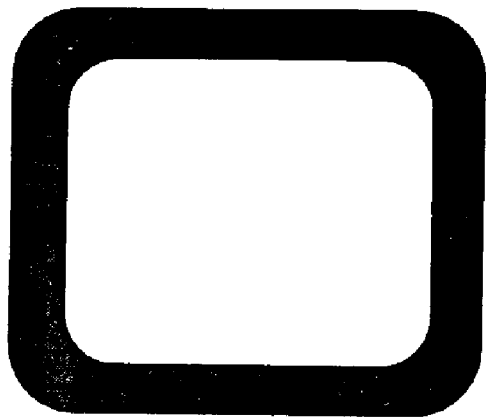
FIGS. 5A-5C are more detailed diagrams of the compressible support members shown in FIGS. 1-4.
Figure 5B:
Figure 5C:
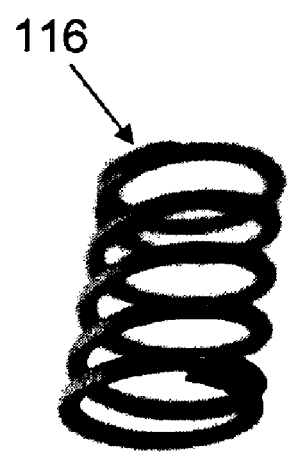

In addition, alignment posts 110 (which can spring 111 loaded) are connected to the thermally conductive device 100. The alignment posts 110 are positioned outside a periphery of the chip carrier 118. The alignment posts 110 extend through openings in the circuit board 122 and are connected to backing plate 124. Ends 126 connect the backing plate 124 to the alignment posts 110. The alignment posts 110 are positioned through openings in the circuit board 122 and can freely move through the circuit board 122. The alignment posts aren't just for alignment, they are in tension, to apply the compressive load that is needed to make the LGA connections work. One common way to generate (and maintain this load) is to incorporate coil springs 111 between the heads of these posts and the base of the heatsink. Another common way is to use a single leaf spring that engages the ends of all four alignment posts, but on the back side of the board/card. Then a screw is used to load the spring against the backing plate. When a force (indicated by the arrow in the right side of FIG. 1) is applied to the thermally conductive device 100, by springs 111, the alignment posts 110 can move down through the circuit board 122 thereby exerting force on the integrated circuit chip 106 through the heat spreader 104. As discussed above, if this force is not distributed, it can damage the chip 106, the chip carrier 118, thermal adhesive 105, and/or the circuit board 122. The compressible support members 116 distribute a portion of this force away from the chip 106 to the chip carrier 118. Thus, the force transmitted through the conductive device 100 is distributed between the integrated circuit chip 106 and the chip carrier 118 by the compressible support members 116. The support members 116 can comprise at least one compressible ring or Frame (FIG. 5A), a portion of compressible material (FIG. 5B), springs (FIG. 5C), etc.

One feature of the invention is that the durometer (rate of compressibility or coefficient of elasticity) of the support members 116 is specifically selected to distribute only a portion of the force from the thermally conductive device 100 to the chip carrier 118. Therefore, with the invention, the force is not directed exclusively to the support members 116. Instead, only a percentage of the force being exerted by the thermally conductive device 100 is distributed to the support members 116. One benefit of the invention is that the chip carrier 118 receives a balanced force from the support members 116 and the chip 106. For example, the chip 106 could bear 50% of the force and the support members 116 could bear 50% of the force. The optimal distribution of force can be found through experimental testing and/or computer simulation.

Figure 2:
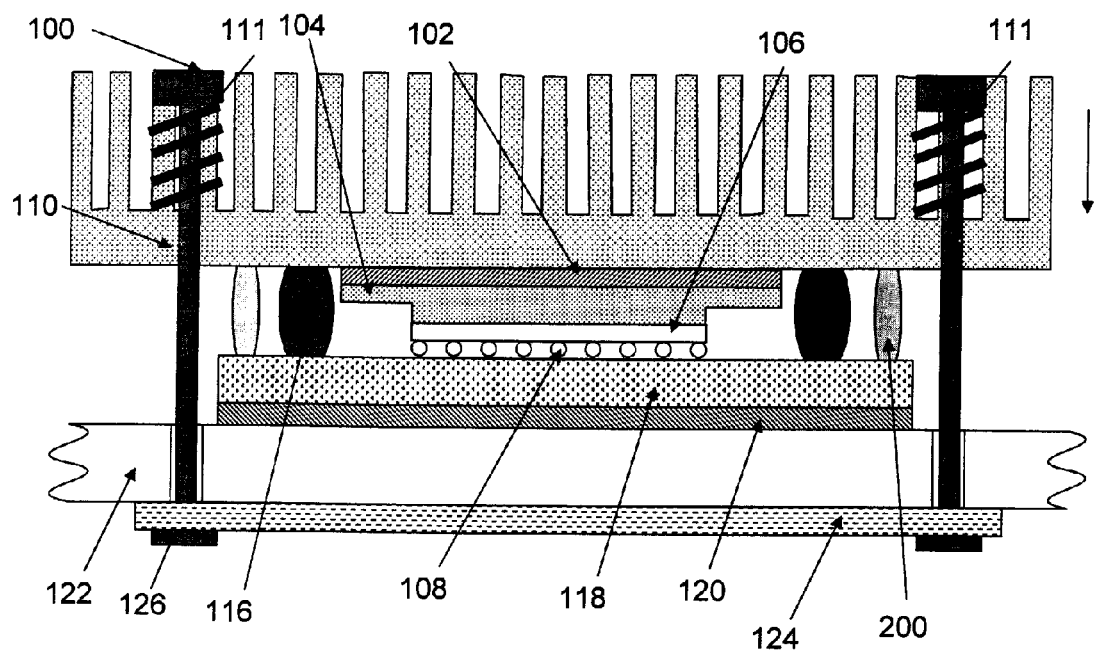
FIG. 2 is cross-sectional schematic diagram of an integrated circuit structure.

Further, as shown in FIG. 2, secondary support members 200 can be utilized in addition to the primary support members 116. Compressive members 116 and 200 may be formed with rectangular cross sections, and then bulge when deformed, as shown in FIGS. 1 and 2. These compressible support members 116, 200 can be positioned between the chip carrier 118 and the thermally conductive device 100 at different distances from the integrated circuit chip 106. The compressible support members 116, 200 can have different durometers to more precisely balance the load being distributed to the chip carrier 118. For example, the compressible support members 116 can comprise different sized concentric rings having different durometer values. Their placement and position retention can be automated and maintained by adhesives respectively.

Figure 3:
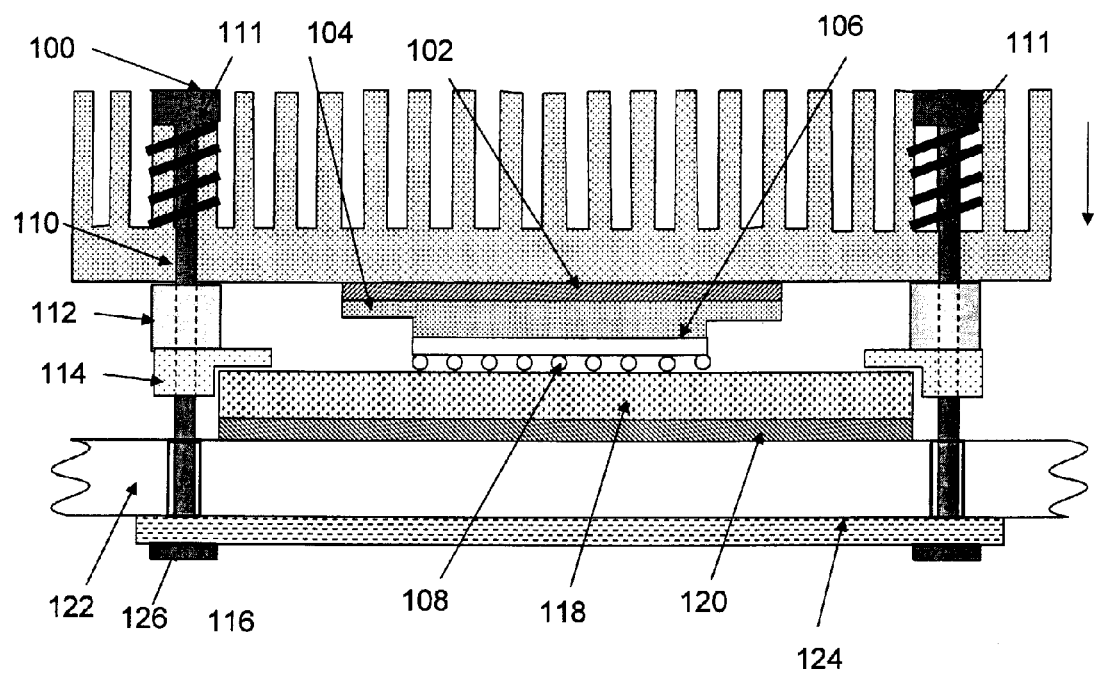
FIG. 3 is cross-sectional schematic diagram of an integrated circuit structure.
Figure 6:
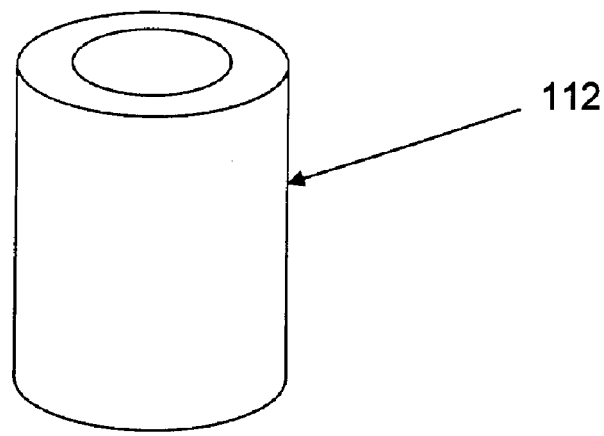
FIG. 6 is a more detailed diagram of the compressible tube shown in FIGS. 3-5.

In another embodiment shown in FIG. 3, a frame 114 is positioned at the edges of the chip carrier 118. Different types of frames 114 are shown in FIGS. 7-10 and are discussed in greater detail below. In this embodiment the alignment posts 110 extend through openings in the circuit board 122 and openings in the frame 114. Compressible frame support members 112 are positioned around an upper section of the alignment posts 110 between the thermally conductive device 100 and the frame 114. The compressible support member 112 can comprise a spring, a tube of compressible material, a compressible ring, etc. In one example shown in FIG. 6, the compressible frame support members 112 can comprise a compressible tube.

Figure 8:
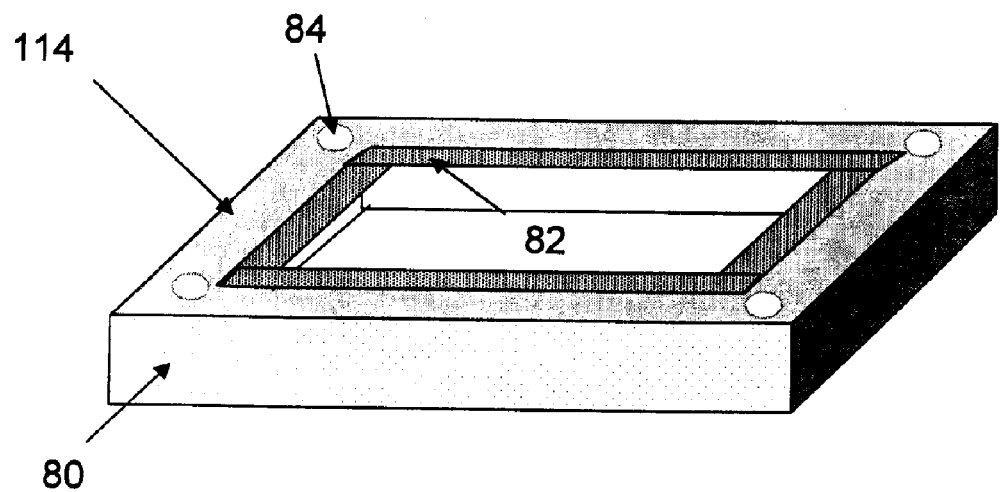
FIG. 8 is a perspective diagram of the frame shown in FIGS. 3-5.

The rigid frame 114 and compressible frame support members 112 can move freely along the alignment posts 110 (especially in the case of a continuous frame around the perimeter of the chip carrier, as shown in FIG. 8). Therefore, the frame 114 is adapted to impart, on the chip carrier 118, force transmitted from the thermally conductive device 100 through the compressible frame support member 112. Thus, this embodiment presents an alternative way in which the force transmitted through the conductive device is distributed between the integrated circuit chip 106 and the chip carrier 118 by the compressible support member 112 and the rigid frame 114. This embodiment is advantageous because it distributes the force to the very edge of the chip carrier 118, thereby spreading out the load, and/or not consuming carrier surface are closer to the chip that may be needed for other components, such as capacitors. By distributing the force to the edge of the chip carrier 118, the frame improves the uniformity of the applied load on the LGA connector, and reduces the stress in the carrier, chip, and thermal adhesive.

Figure 4:
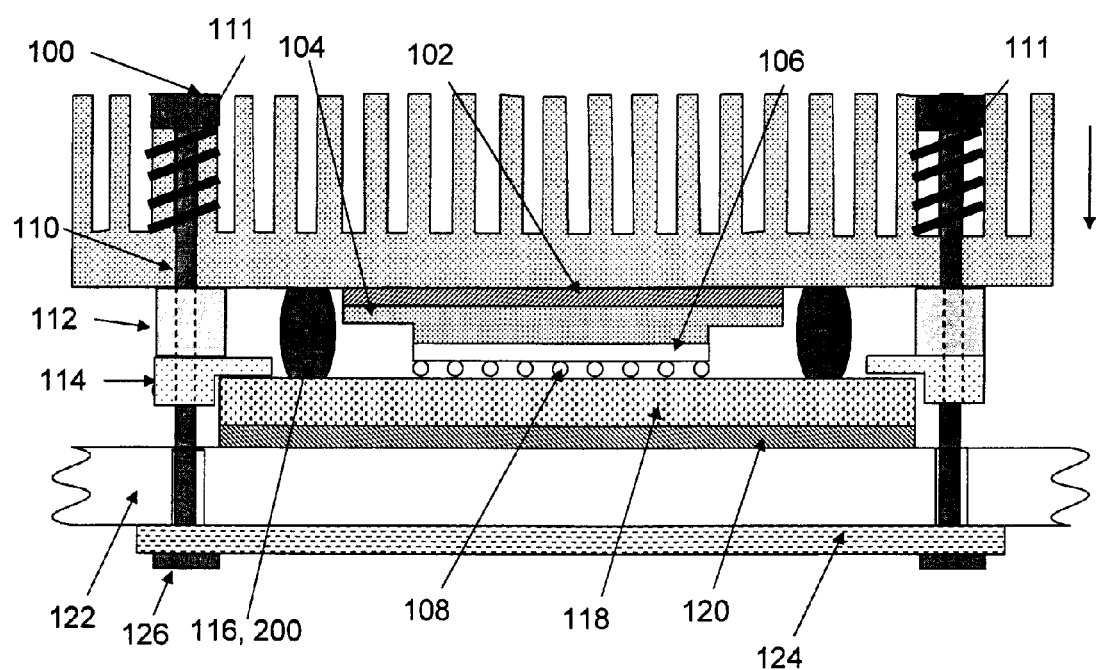
FIG. 4 is cross-sectional schematic diagram of an integrated circuit structure.
Figure 7:
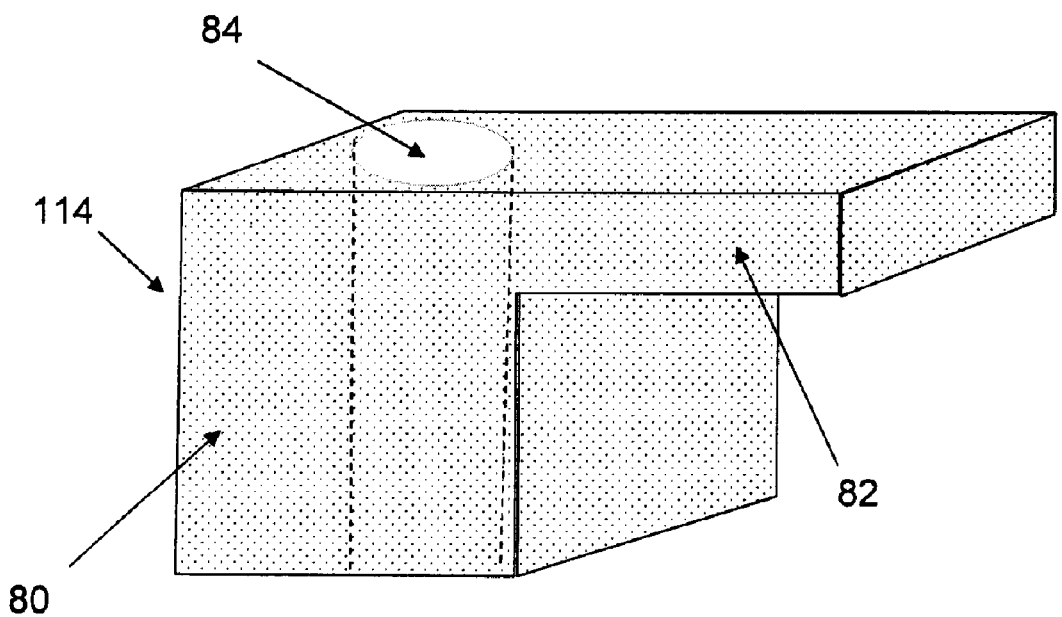
FIG. 7 is a perspective diagram of a portion of the frame shown in FIGS. 3-5.

In additional embodiments shown in FIG. 4, the frame 114 and frame support member 112 can be used in combination with one or more primary and secondary support members 116, 200. By using additional combinations of multiple support members and the frame, the force can be even more evenly distributed across the chip carrier 118. FIGS. 7-10 illustrate some embodiments of the frame 114. These embodiments are not exhaustive, but merely illustrate some of the different shapes the frame 114 can take. One ordinarily skilled in the art would understand that different shapes/sizes of frames can be utilized with the invention. As shown in FIG. 7, the frame 114 can have an L-shape in cross-section, such that the frame 114 includes a first portion 82 that extends over the chip carrier 118 and a second portion 80 having an opening 84 through which the alignment post 110 passes.

Figure 9:
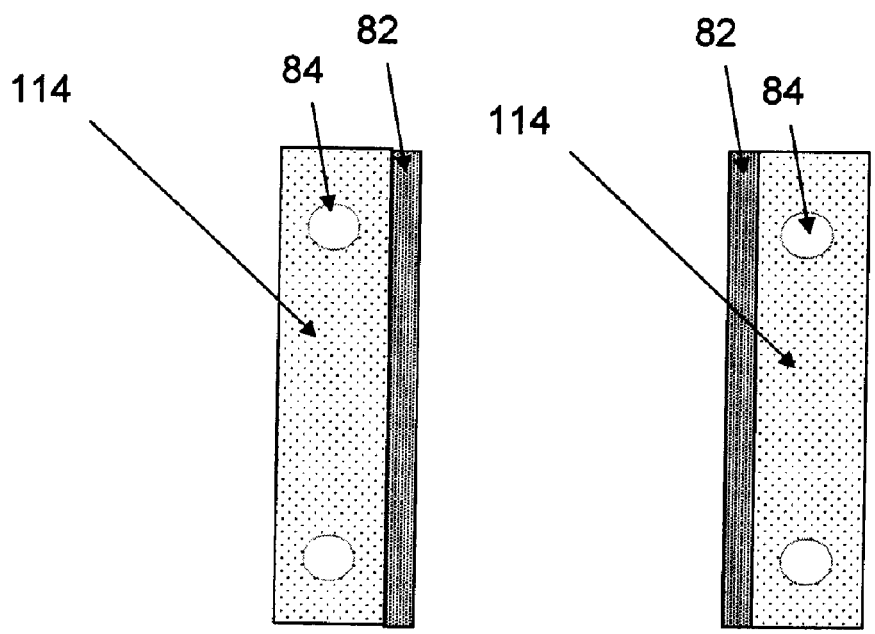
FIG. 9 is a top-view diagram of the frame shown in FIGS. 3-5.
Figure 10:
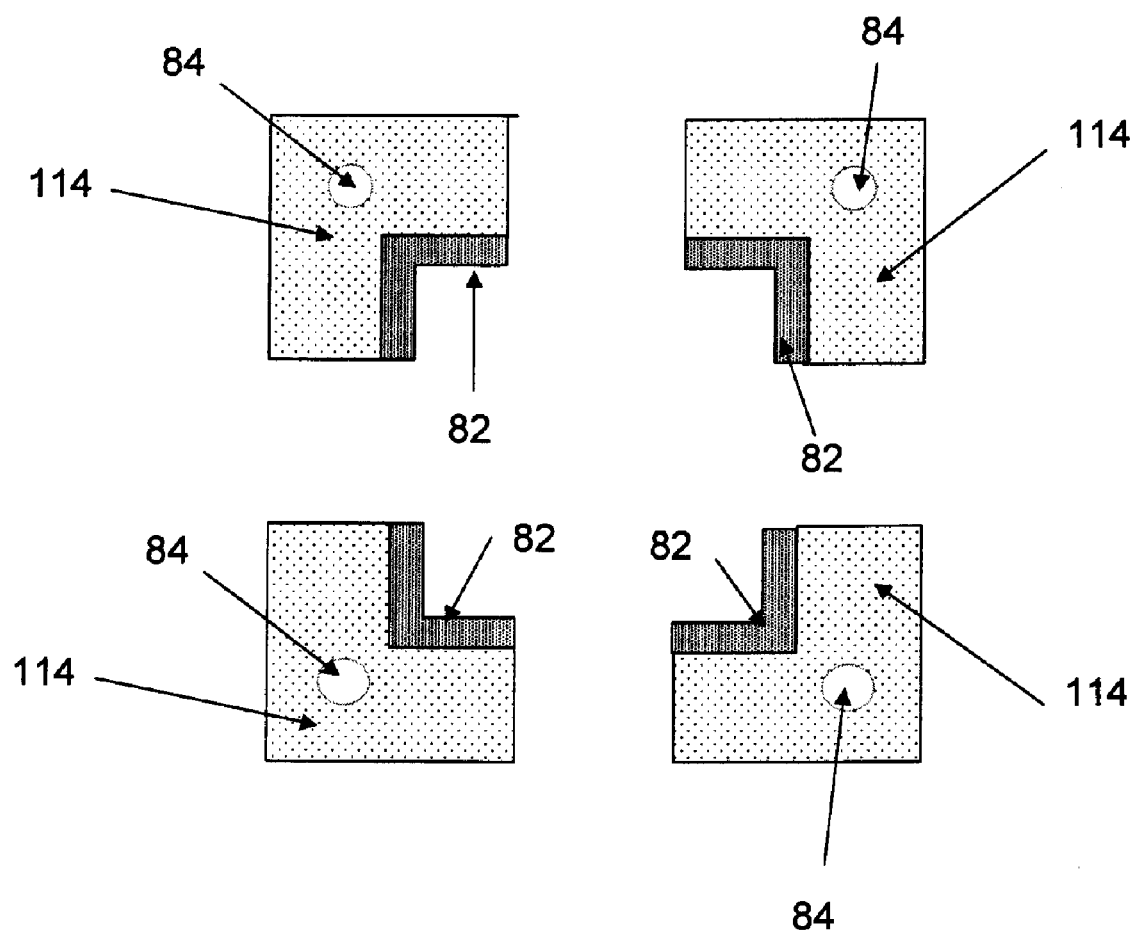
FIG. 10 is a top-view diagram of a portion of the frame shown in FIGS. 3-5.

The frame 114 can comprise a continuous or a discontinuous structure, but a continuous structure will minimize the risk of binding on posts 110. Therefore, as shown in FIG. 7, the frame 114 can comprise box-like L-shaped structures. Alternatively, as shown in FIG. 8, the frame 114 can comprise a rectangular continuous box-shaped structure that has an L-shape in cross-section. Alternatively, as shown in FIG. 9, which illustrates the frame 114 from a top-view, the frame 114 can comprise opposing elongated structures, each of which has an L-shape in cross-section. As another alternative shown in FIG. 10, the frame 114 can comprise corner portions each of which again has an L-shape in cross-section.

Figure 11:
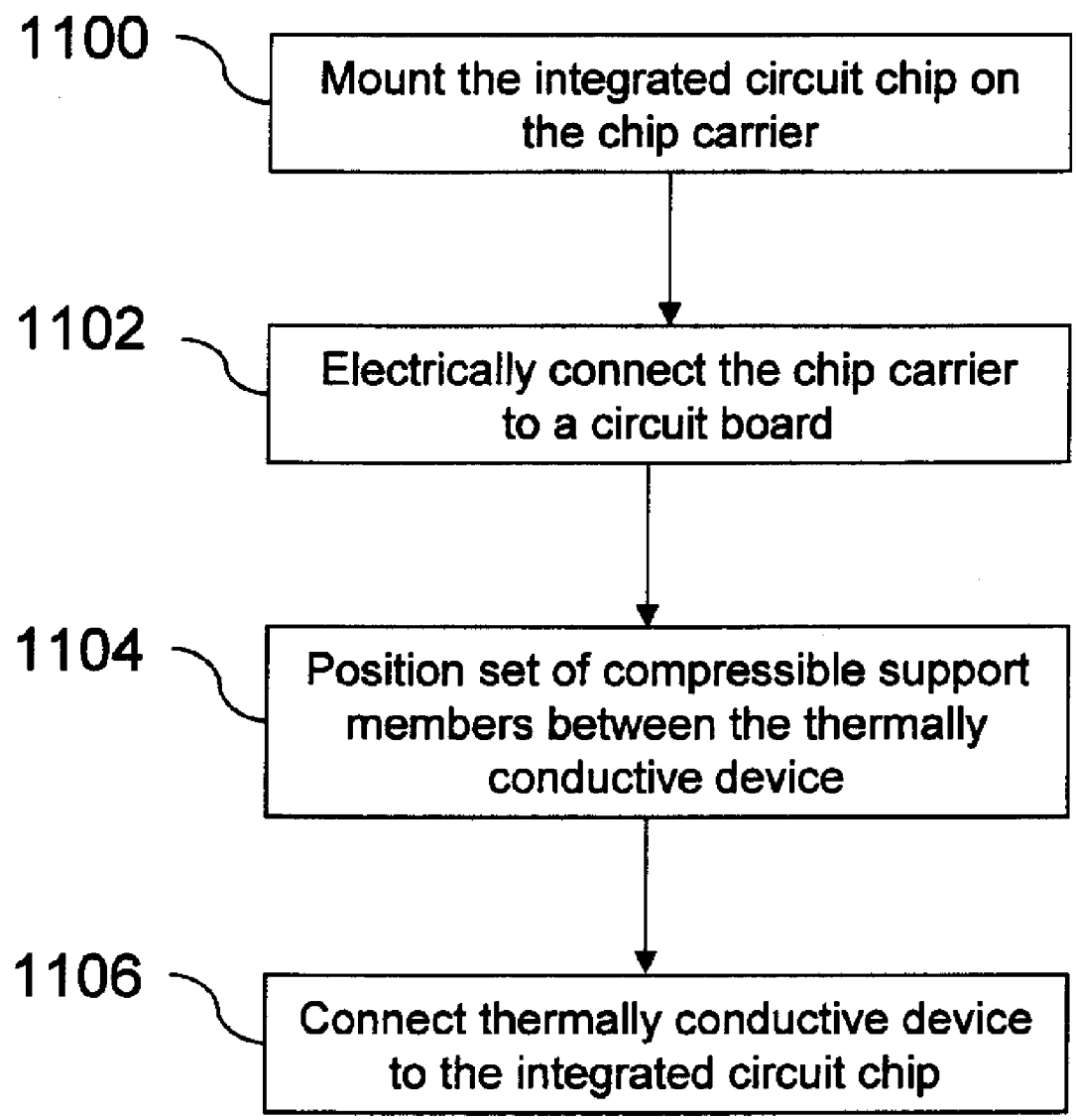
FIG. 11 is a flowchart illustrating the processing of the invention.

FIG. 11 is a flowchart illustrating the processing of the invention. More specifically, in item 1100, the invention mounts the integrated circuit chip on the chip carrier and in item 1102, the invention electrically connects the chip carrier to a circuit board. This process can connect spring-loaded alignment posts to the thermally conductive device. The set of compressible support members are positioned between the thermally conductive device and the chip carrier in item 1104 and the thermally conductive device is connected to the integrated circuit chip in item 1106. This process positions the compressible support members between the chip carrier and the thermally conductive device at different distances from the integrated circuit chip, to balance the load. Again, the compressible support members transmit force from the thermally conductive device to the chip carrier and this force is evenly distributed between the integrated circuit chip and the chip carrier by the compressible support members.

Therefore, as shown above, the invention provides a structure that better distributes the force being exerted by the thermally conductive device 100 on the chip carrier 118. This reduces the likelihood that the chip 106, chip carrier 118, thermal adhesive 105, and/or circuit board 122 will be damaged by the force of the thermally conductive device 100.

By applying a more uniform load onto the LGA layer, with the invention the electrical connections are more reliable, and/or the total applied force may be reduced. This is because LGA connections require a certain minimum load. So the more uniform the load, the lower the total load needs to be to achieve the minimum required loading at each of the connections. By having a more uniform loading, the substrate (chip carrier) stresses are reduced, which may allow for reductions in substrate thickness and socket engagement hardware and therefore cost. By reducing the force on the heat spreader, there is less stress in the thermal adhesive which can cause delamination and lower thermal conduction to the heat spreader. By reducing the load on the heat spreader, there is less bending and stress that could lead to fracture of the heat spreader, or put the thermal adhesive in tension. By being able to fine tune the load distribution, the thickness and cost of the backing plate on the underside of the board may be reduced. By reducing the force through the chip, there is less risk of chip cracking or C4 creep.

Although the invention only depicts an LGA socket engagement the same load distribution system can be used for soldered or electrically conductive polymer connections to a board. In this case, the load distribution would be used to minimize the effects of solder creep or polymer relaxation that can cause device failure.

While the invention has been described in terms of preferred embodiments, those skilled in the art will recognize that the invention can be practiced with modification within the spirit and scope of the appended claims.

What is claimed is:

1. An integrated circuit chip mounting structure comprising:
   a circuit board;
   a chip carrier electrically connected to said circuit board;
   an integrated circuit chip mounted on said chip carrier;
   a heat spreader having a bottom surface connected to a top surface of said integrated circuit chip, wherein said heat spreader has a top surface, opposite said bottom surface, that is larger in surface area than said top of said integrated circuit chip;
   a thermally conductive adhesive on said top surface of said heat spreader;

a thermally conductive device thermally connected to said thermally conductive adhesive;

a rigid frame positioned on said chip carrier, wherein said frame is adapted to impart, on said chip carrier, force transmitted from said thermally conductive device;

spring-loaded alignment posts connected to said thermally conductive device, wherein said spring-loaded alignment posts extend through openings in said circuit board and openings in said frame, wherein said spring-loaded alignment posts comprise springs positioned between tops of said spring-loaded alignment posts and a bottom of said thermally conductive device, and wherein said alignment posts are positioned outside a periphery of said chip carrier; and compressible support members positioned between said bottom of said thermally conductive device and said frame, wherein said spring-loaded alignment posts pass through said circuit board, said frame, and said compressible support members, and wherein said frame contacts said chip carrier, said spring-loaded alignment posts, and said compressible support members.

2. The integrated circuit chip mounting structure according to claim 1, wherein said frame includes a first portion that extends over said chip carrier and a second portion through which said alignment posts pass.

3. The integrated circuit chip mounting structure according to claim 1, wherein said compressible support members comprise at least one of springs, tubes of compressible material, and compressible rings.

4. The integrated circuit chip mounting structure according to claim 1, wherein said frame has an L-shape in cross-section.

5. The integrated circuit chip mounting structure according to claim 1, wherein said frame comprises one of a continuous and a discontinuous structure.

6. The integrated circuit chip mounting structure according to claim 1, wherein force transmitted through said conductive device is distributed between said integrated circuit chip and said chip carrier by said compressible support member and said frame.

* * * * *